(12) United States Patent
Downey et al.

(10) Patent No.: US 7,135,733 B2
(45) Date of Patent: Nov. 14, 2006

(54) CAPACITOR FOR INTEGRATION WITH COPPER DAMASCENE PROCESSES AND A METHOD OF MANUFACTURE THEREFORE

(75) Inventors: Stephen Downey, Orlando, FL (US); Edward Harris, Orlando, FL (US); Sailesh Merchant, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 264 days.

(21) Appl. No.: 10/195,935

(22) Filed: Jul. 16, 2002

(65) Prior Publication Data

US 2002/0177287 A1 Nov. 28, 2002

Related U.S. Application Data

(63) Continuation of application No. 09/489,092, filed on Jan. 21, 2000, now Pat. No. 6,498,364.

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. .................... 257/306; 257/296; 257/307; 257/311; 257/758

(58) Field of Classification Search ......... 257/296–306, 257/307, 311, 758
See application file for complete search history.

(56) References Cited

U.S. PATENT DOCUMENTS

| | | | | |
|---|---|---|---|---|
| 5,879,985 A | * | 3/1999 | Gambino et al. | 438/253 |
| 6,017,790 A | | 1/2000 | Liou et al. | |
| 6,037,216 A | * | 3/2000 | Liu et al. | 438/253 |
| 6,124,199 A | * | 9/2000 | Gambino et al. | 438/622 |
| 6,156,655 A | | 12/2000 | Huang et al. | |
| 6,174,803 B1 | * | 1/2001 | Harvey | 438/638 |
| 6,200,866 B1 | * | 3/2001 | Ma et al. | 438/299 |
| 6,211,068 B1 | | 4/2001 | Huang | |
| 6,252,290 B1 | | 6/2001 | Quck et al. | |
| 6,261,963 B1 | | 7/2001 | Zhao et al. | |
| 6,271,596 B1 | | 8/2001 | Alers | |
| 6,277,728 B1 | * | 8/2001 | Ahn et al. | 438/619 |
| 6,294,834 B1 | * | 9/2001 | Yeh et al. | 257/758 |
| 6,313,491 B1 | * | 11/2001 | Shuto | 257/295 |
| 6,339,029 B1 | | 1/2002 | Yu et al. | |
| 6,387,770 B1 | * | 5/2002 | Roy | 438/384 |
| 6,452,251 B1 | * | 9/2002 | Bernstein et al. | 257/532 |
| 6,491,735 B1 | * | 12/2002 | Najm | 55/492 |
| 6,492,222 B1 | * | 12/2002 | Xing | 438/240 |
| 6,495,445 B1 | * | 12/2002 | Clevenger et al. | 438/619 |
| 6,720,598 B1 | * | 4/2004 | Wohlfahrt | 257/295 |
| 6,727,536 B1 | * | 4/2004 | Hasegawa et al. | 257/295 |
| 6,727,589 B1 | * | 4/2004 | Greco et al. | 257/751 |
| 6,770,570 B1 | * | 8/2004 | Li et al. | 438/766 |
| 6,838,717 B1 | * | 1/2005 | Yen et al. | 257/295 |
| 6,888,716 B1 | * | 5/2005 | List et al. | 361/306.2 |
| 2005/0247968 A1 | * | 11/2005 | Oh et al. | 257/306 |

* cited by examiner

*Primary Examiner*—Jerome Jackson
*Assistant Examiner*—Jesse A. Fenty

(57) ABSTRACT

The present invention provides a capacitor for use in a semiconductor device having a damascene interconnect structure, such as a dual damascene interconnect, formed over a substrate of a semiconductor wafer. In one particularly advantageous embodiment, the capacitor, comprises a first capacitor electrode, such as copper, comprised of a portion of the damascene interconnect structure, an insulator layer formed on the damascene interconnect structure wherein the insulator layer is a passivation layer, such as silicon nitride. The passivation layer may be an outermost or final passivation layer, or it may be an interlevel passivation layer. The capacitor further includes a second capacitor electrode comprised of a conductive layer, such as aluminum, that is formed on at least a portion of the insulator layer.

18 Claims, 3 Drawing Sheets

CAPACITOR FOR INTEGRATION WITH COPPER DAMASCENE PROCESSES AND A METHOD OF MANUFACTURE THEREFORE

This application is a continuation of U.S. patent application Ser. No. 09/489,092, entitled "A CAPACITOR FOR INTEGRATION WITH COPPER DAMASCENE PROCESSES AND A METHOD OF MANUFACTURE THEREFORE, filed on Jan. 21, 2000, now U.S. Pat. No. 6,498,364. The above-listed application is commonly assigned with the present invention and is incorporated herein by reference as if reproduced herein in its entirety.

TECHNICAL FIELD OF THE INVENTION

The present invention is directed, in general, to fabricating a capacitor for use in a semiconductor device, and more specifically, to a capacitor for integration with copper damascene processes and a method of manufacture therefore.

BACKGROUND OF THE INVENTION

Capacitors have gained wide acceptance and use in today's integrated circuit technology. As is well known, a common capacitor essentially comprises two conductive plates separated by an insulator. It is normal for the conductive plates to be made of aluminum and the insulator to be a dielectric material, such as silicon dioxide ($SiO_2$).

Originally, capacitors were often placed upon a substrate of the integrated circuit (IC) and electrically connected to contact or via structures, as required by design. While these structures were quite effective, their presence caused a topographical aberration in the overlying dielectric material, such that the capacitor's structure would be reflected in the surface of the dielectric layer. As a result, special planarization techniques had to be performed to remove the aberration so that subsequent photolithographic processes were not adversely affected. The effect of the capacitor's aberrations in the photolithographic processes became even more acute as device sizes decreased.

Given the planarization problems associated with the earlier capacitor structures, the semiconductor manufacturing industry sought ways to form the capacitors while lessening their impact on the topography of the overlying dielectric layer. One such approach was to form the capacitor within a contact or via opening. This approach has worked very well for the larger submicron technologies. Because the capacitor was formed within the contact opening or via, its structure did not heavily influence the overlying dielectric layer. As such, the planarization problems present with previous capacitor structures were substantially reduced.

As the design rules have continued to decrease, however, difficulty has arisen with respect to forming a capacitor within these structures. Because smaller device size requires greater precision in the etching processes, the industry is moving toward an etching process known as damascene processing. Because the completed damascene structure has an upper cavity with a width larger than the lower cavity, a stair step topography results within the damascene opening. This damascene process provides more control when forming the trace openings, which in turn allows for manufacturing ICs in the submicron range.

The invention of the damascene process for forming trace openings allowed for the manufacture of ICs in the submicron range. However, because of the damascene's stair step topography, it has proven much more difficult to form capacitors within these damascene openings. One reason for this difficulty, stems from deposition problems that arise due to the deposition of the various layers needed for the capacitor, over the stair step topography. Because of the increased topography, the thickness of the layers that form the capacitor may vary significantly within the damascene structure. This variance in material thickness is difficult to control and makes it very difficult to achieve the desired degree of capacitance. Moreover, because of the number of layers that must be deposited within the smaller portion of the damascene structure, the material necessary to achieve the desired degree of conduction may not be adequately deposited within the damascene structure. Furthermore, voids may also be formed. Because of these uncertainties, the capacitor cannot be easily and consistently manufactured to the desired level.

Accordingly, what is needed in the art is a capacitor structure and a process for forming that capacitor structure that avoids the disadvantages associated with prior art structures and processes.

SUMMARY OF THE INVENTION

To address the above-discussed deficiencies of the prior art, the present invention provides a capacitor for use in a semiconductor device having a damascene interconnect structure, such as a dual damascene interconnect, formed over a substrate of a semiconductor wafer. In one particularly advantageous embodiment, the capacitor, such as a metal-insulator-metal (MIM) capacitor, comprises a first capacitor electrode, such as copper, comprising a portion of the damascene interconnect structure. The capacitor further includes an insulator layer formed on the damascene interconnect structure wherein the insulator layer is a passivation layer, such as silicon nitride. The passivation layer may be an outermost or final passivation layer, or it may be an interlevel passivation layer within an integrated circuit. The capacitor further includes a second capacitor electrode comprised of a conductive layer, such as aluminum, that is formed on at least a portion of the insulator layer.

The material selected for the capacitor may vary. For example, in one embodiment, the insulator may be silicon nitride. However, in alternative embodiments, the insulator may be tantalum pentoxide. When using certain alternative embodiments, such as tantalum pentoxide with copper, it may be necessary to include an appropriate barrier layer to prevent migration of the copper into the surrounding dielectric.

In another aspect of the present invention, the semiconductor device includes a plurality of damascene interconnect structures that are electrically isolated from each other by a dielectric material. On any given layer on which the capacitor is to be formed, the passivation layer is formed on each of the plurality of interconnect structures.

In certain embodiments, the conductive layer is formed on at least two of the interconnect structures. Yet in another embodiment, the damascene interconnect is an outermost or final damascene interconnect structure, the insulator layer is an outermost capping layer and the second capacitor electrode comprises a portion of an outermost conductive layer formed on at least a portion of the insulator layer. This particular embodiment is particularly advantageous because the capacitor is formed on the outermost layers of the semiconductor wafer and the planarization problems that exist at prior levels are avoided. In such embodiments, the outermost layer may also be used to form a bond pad for the semiconductor device.

In yet another aspect, the present invention provides a semiconductor device formed on a substrate of a semiconductor wafer. This particular embodiment includes transistors formed over the substrate, damascene interconnect structures formed over and electrically connected to the transistors, an insulator passivation layer formed on one of the damascene interconnect structures, a conductive layer formed over one of the damascene interconnect structures, and the capacitor as previously described above, including the various embodiments.

A method of fabricating a capacitor for use in a semiconductor device having a damascene interconnect structure formed over a substrate of a semiconductor wafer is also provided. In this embodiment, the method includes forming a first capacitor electrode comprised of a portion of the damascene interconnect structure, forming an insulator layer formed on the damascene interconnect structure, wherein the insulator layer being a passivation layer, and forming a second capacitor electrode comprised of a conductive layer formed on at least a portion of the insulator layer.

The method embodiments also include steps of forming the variations of the devices as discussed above with respect to the capacitor. However, in those embodiments where the capacitor is formed on an interlevel dielectric, as opposed to the outermost dielectric level, the method further comprises planarizing the damascene interconnect structure prior to depositing the insulator material and further comprises planarizing a dielectric that is deposited over the capacitor once it is formed with a planarization process, such as chemical/mechanical planarization techniques.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
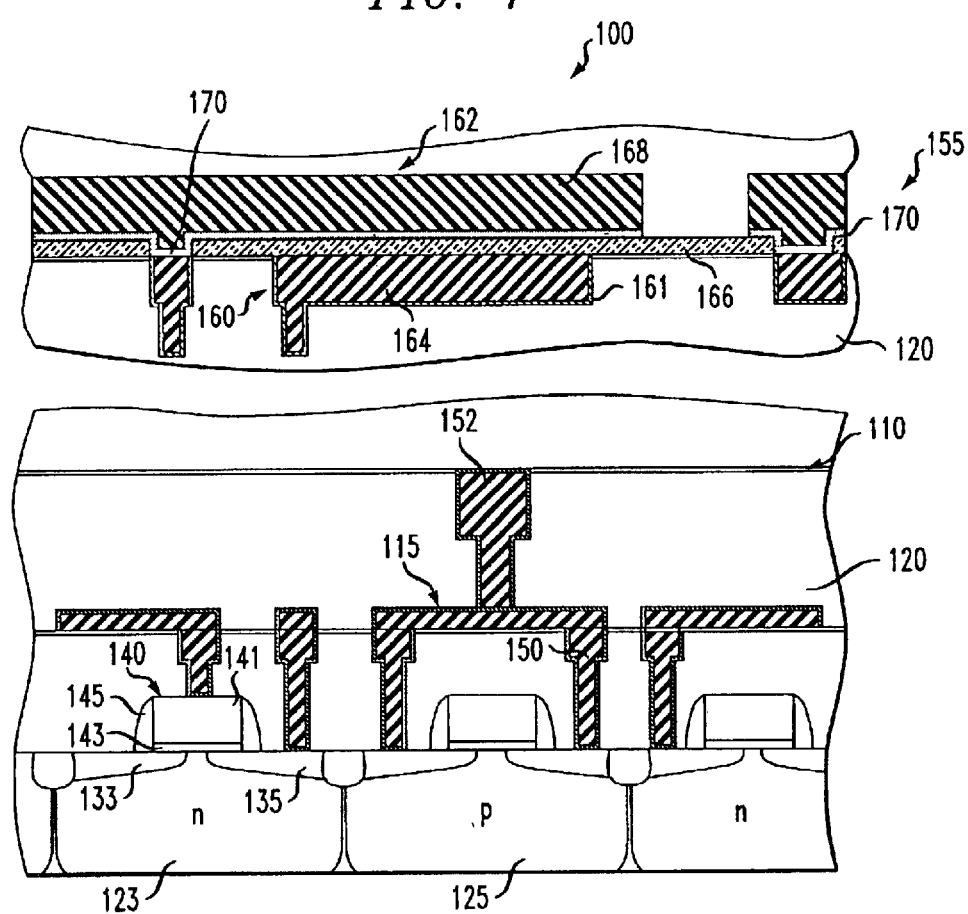
FIG. 1 illustrates a partial sectional view of one embodiment of a semiconductor device covered by the present invention.

Referring initially to FIG. 1 there is illustrated a sectional view of one embodiment of a semiconductor device 100 covered by the present invention. The semiconductor device 100 shows a portion of a conventionally formed integrated circuit (IC) 110, such as a complementary metal oxide semiconductor (CMOS) device. One having skill in the art knows that the portion of the IC 110 can comprise any number of interconnects 115 and dielectric layers 120 such as to form the desired semiconductor device 100. In the illustrated embodiment of FIG. 1, the portion of the IC 110 contains conventionally formed twin tubs, including an n-tub 123 and a p-tub 125. Also illustrated in FIG. 1 are source regions 133 and drain regions 135 both of which are formed using conventional methods.

A conventional gate electrode structure 140 may be formed, straddling the source region 133 and drain region 135. The gate structure 140 consists of a conventionally formed gate 141, oxide layer 143 and spacers 145. Conventionally formed damascene plugs 150 or vias 152 connect the different layers of the IC 110. The damascene process is used in place of the traditional etch processes to allow for more control when forming the damascene structure. This is especially important because copper is increasingly becoming the conductor of choice, over aluminum as the conductive material, and copper is harder to etch in a controlled manner than aluminum.

The top portion 155 shown in FIG. 1, illustrates a damascene interconnect structure 160 from which a capacitor 162 is formed. In one embodiment of the invention, the capacitor 162 is a metal-insulator-metal (MIM) capacitor. The damascene interconnect structure 160 forms a first capacitor electrode 164. In a preferred embodiment, the damascene interconnect structure 160 comprises copper. Furthermore, when the damascene interconnect structures 160 comprise copper (Cu) an optional barrier layer 161 may be conventionally formed such that the Cu damascene interconnect structures 160 are not in contact with the dielectric layer 120, which is preferably $SiO_2$. Thus, the barrier layer prevents the Cu from diffusing into the $SiO_2$ dielectric layer 120, and vice versa. In a preferred embodiment, the barrier layer 161 includes a tantalum nitride (TaN) layer, however, one having skill in the art understands that other similar barrier layers, such as tantalum, may be used. If the copper is electroplated, a seed layer may be required to be formed on top of the barrier layer 161. Furthermore, one having skill in the art understands that other, similar conductive materials known to those skilled in the art may also be used for the damascene interconnect structure 160. The capacitor 162 further includes an insulator layer 166, such as a silicon nitride layer, and a second or upper capacitor electrode 168, which may comprise conventional materials, such as aluminum, aluminum alloy or a stacked metal. When the damascene interconnect structures 160 comprise copper (Cu) and the upper capacitor electrode 168 comprises aluminum (Al), a Cu/Al barrier layer 170 should be conventionally deposited between the interconnect structure 160 and the upper capacitor electrode 168 to prevent diffusion. In the illustrated embodiment the Cu/Al barrier layer 170 comprises tantalum nitride (TaN), however one having skill in the art knows that a material having similar properties, such as titanium nitride (TiN), may be used.

The damascene interconnect structure 160 may be either a single damascene interconnect structure or a dual damascene interconnect structure. However, the dual damascene interconnect structure provides advantages over the prior techniques. For example, the dual damascene interconnect structure allows for manufacturing ICs less than 0.25 μm in size, a feature that was not available in the traditional trench etching or single damascene process. The illustrated damascene interconnect structure 160 may be the outermost or top damascene interconnect structure 160 of the semiconductor device 100. Alternatively, however, it may be an interlevel damascene interconnect structure. Thus, the capacitor 162 may be constructed at various levels within the semiconductor device 100. However, as explained below in a preferred embodiment, the capacitor 162 is constructed using the outermost or top damascene interconnect structure.

Figure 2:
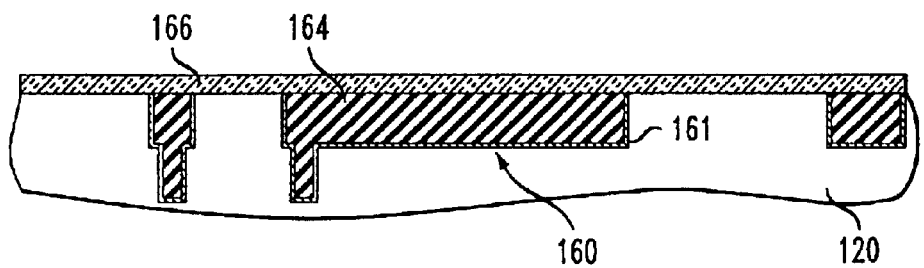
FIG. 2 illustrates a partial sectional view of the damascene interconnect structure as illustrated in FIG. 1, including the insulator layer formed over the damascene interconnect structure.

Turning now to FIG. 2 with continued reference to FIG. 1, there is illustrated a sectional view of the damascene interconnect structure 160 as illustrated in FIG. 1. The interconnect structure 160 includes the insulator layer 166 formed over the damascene interconnect structure 160, and the barrier layer 161 separates the copper damascene interconnect structure 160 from the $SiO_2$ dielectric layer 120. In a preferred embodiment the barrier layer 161 is conformally deposited over the substrate surface and within the damascene interconnect structure 160, after which copper is deposited over the barrier layer 161 and within the damascene interconnect structure 160. The copper and the barrier layer 161 are polished back using conventional chemical/mechanical process so that the barrier layer 161 and the copper are located only within the damascene interconnect structure 160. In another preferred embodiment, the insulator layer 166 is deposited using conventional deposition processes, such as chemical vapor deposition (CVD) or physical vapor deposition (PVD). In an advantageous embodiment, the insulator layer 166 is typically deposited as a passivation layer. As well known, in some processes, semiconductor devices may be passivated with a capping layer at the end of the fabrication process to protect or seal the semiconductor device from deleterious environmental contaminants. Thus, in this particular embodiment, no extra steps have been necessary to fabricate either the first capacitor electrode 164 or the insulator layer 166 of the capacitor 162. As shown, the insulator or passivation layer 166, such as tantalum pentoxide, is formed over the entire surface of the planarized IC 110.

Figure 3:
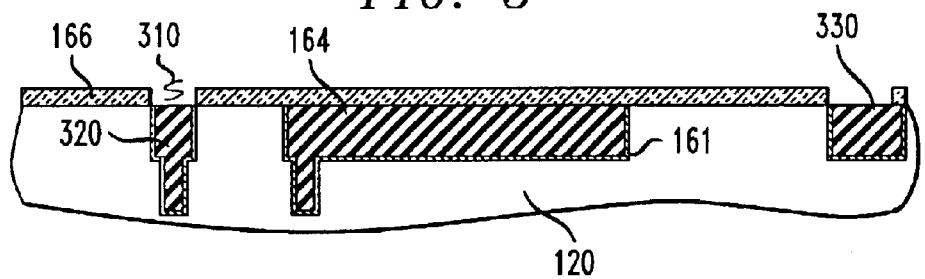
FIG. 3 illustrates a partial view of the semiconductor device shown in FIG. 2, following patterning and etching of the insulator layer.

Turning now to FIG. 3, there is illustrated a partial view of the semiconductor device 100 shown in FIG. 2 following patterning and etching of the insulator layer 166. Conventional patterning and etching processes may be used to form openings 310 within the insulator layer 166. The portions of insulator layer 166 are removed to define the capacitor dielectric of the capacitor 162. In the embodiment illustrated in FIG. 3, a portion of the insulator layer 166 as been removed over damascene structures 320 and 330.

Figure 4:
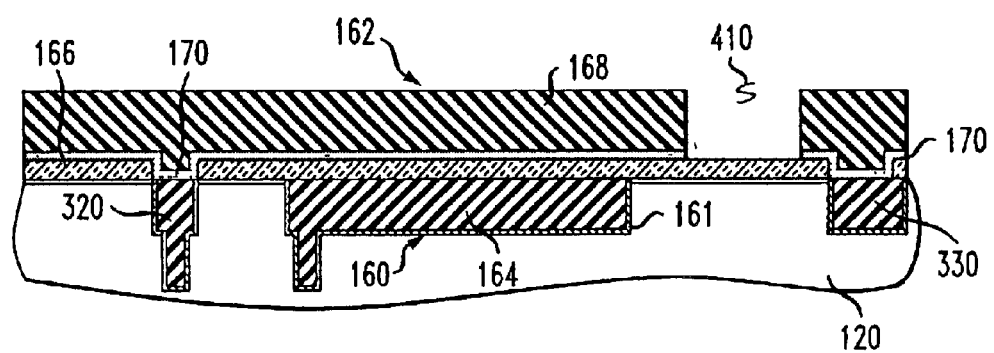
FIG. 4 illustrates the damascene interconnect structure covered by portions of the insulator layer as illustrated in FIG. 3, with a second capacitor electrode, which is preferably comprised of a conductive layer, located on at least a portion of the insulator layer.

Turning to FIG. 4, illustrated is the damascene interconnect structure 160 covered by portions of the insulator layer 166 as illustrated in FIG. 3, with a second capacitor electrode 168, which is preferably comprised of a conductive layer, located on at least a portion of the insulator layer 166. The conductive layer may, if desired so, be a metal layer or a doped polysilicon layer. Not shown in FIG. 4 is the step of conventionally depositing the conductive layer over the entire surface of the semiconductor device 100 and patterning and etching the conductive layer to end up with the capacitor 162 as shown in FIG. 4. In a preferred embodiment the second capacitor electrode 168 may comprise aluminum, an aluminum alloy, such as aluminum/copper, or a conventional stacked metal. However, as one having ordinary skill in the art obviously knows, any material used as conductive materials in semiconductor devices may be used.

Figure 5:
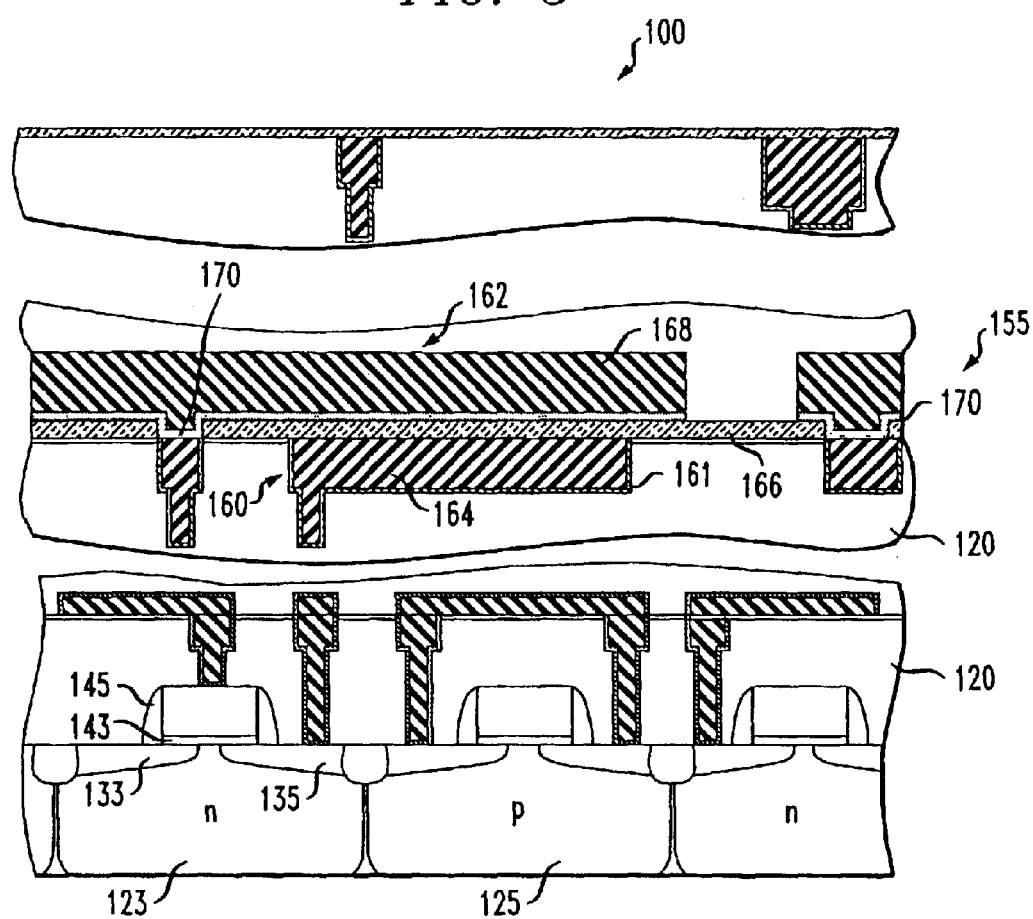
FIG. 5 illustrates a partial section view of the damascene interconnect structure located at an intermediate level within the semiconductor device.

As discussed previously, the damascene interconnect structure 160 forms the first electrode 164 of the capacitor 162, and it may be formed at any level within the IC 110. FIG. 5 illustrates the capacitor 162, discussed previously, located at a interlevel within the IC 110. When an interlevel of the device is used, planarization processes should be conducted after the deposition of conductive layer from which the capacitor's second capacitor electrode 168 is formed. A planarization process, such as chemical/mechanical processes, may be used. Planarization should be conducted to smooth the irregular topography that results from the earlier planarization of the copper damascene interconnect structure 160.

In a preferred embodiment, however, the capacitor 162 is formed from the outermost damascene interconnect structure 160. The outermost damascene interconnect structure 160 is then covered by an outermost capping layer, which serves as the insulator layer 166. The outermost capping layer may act as the final capping layer of the semiconductor device 100 in some designs. The use of the outermost damascene interconnect 160 is particularly advantageous because no planarization processes are required after the formation of the second capacitor electrode 168, since no substantive, subsequent layers are present in the semiconductor device 100.

The second capacitor electrode 168 may also be formed from deposition processes used to form other parts of the semiconductor device 100. For example, in some cases a conductive layer is often deposited, patterned and etched to form a bond pad. In certain aspects of the present invention, the second capacitor electrode 168 may be formed from this bond conductive layer. Thus, no additional steps are needed to fabricate either first electrode 164, the insulator layer 166 or the second capacitor electrode 168 of the capacitor 162.

Although the present invention has been described in detail, those skilled in the art should understand that they can make various changes, substitutions and alterations herein without departing from the spirit and scope of the invention in its broadest form.

What is claimed is:

1. For use in a semiconductor device having a damascene interconnect structure formed over a substrate of a semiconductor wafer, a capacitor, comprising:
   a first capacitor electrode comprised of a portion of a damascene interconnect structure;
   an insulator layer located on a single plane and on the damascene interconnect structure; and
   a second capacitor electrode comprised of a conductive layer formed on at least a portion of the insulator layer, wherein the conductive layer extends over an interconnect structure located on a same level as the first capacitor electrode, the interconnect structure not forming a portion of a capacitor, wherein an upper surface of the conductive layer defines a single plane.

2. The capacitor as recited in claim 1 wherein the capacitor is a metal-insulator-metal (MIM) capacitor.

3. The capacitor as recited in claim 1 wherein the insulator layer is silicon nitride.

4. The capacitor as recited in claim 1 wherein the first capacitor electrode comprises copper and the second capacitor electrode comprises aluminum.

5. The capacitor as recited in claim 1 wherein the insulator layer is tantalum pentoxide.

6. The capacitor as recited in claim 1 wherein the damascene interconnect structure comprises a plurality of interconnect structures electrically isolated from each other by a dielectric material, the insulator layer formed on each of the plurality of interconnect structures.

7. The capacitor as recited in claim 1 wherein the damascene interconnect is an outermost damascene interconnect structure, the insulator layer is an outermost capping layer and the second capacitor electrode comprises a portion of an outermost conductive layer formed on at least a portion of the insulator layer.

8. A method of fabricating a capacitor for use in a semiconductor device having a damascene interconnect structure formed over a substrate of a semiconductor wafer, comprising:

forming a first capacitor electrode comprised of a portion of a damascene interconnect structure;

forming an insulator layer on a single plane and on the damascene interconnect structure; and forming a second capacitor electrode comprised of a conductive layer formed on at least a portion of the insulator layer, wherein the conductive layer extends over an interconnect structure located on a same level as the first capacitor electrode, the interconnect structure not forming a portion of a capacitor, wherein an upper surface of the conductive layer defines a single plane.

9. The method as recited in claim 8 wherein fabricating the capacitor includes fabricating a metal-insulator-metal (MIM) capacitor.

10. The method as recited in claim 8 wherein forming an insulator layer includes forming a silicon nitride layer.

11. The method as recited in claim 8 wherein forming the first capacitor electrode includes forming the first capacitor electrode with copper and forming the second capacitor electrode includes forming the second capacitor electrode with aluminum.

12. The method as recited in claim 8 wherein forming an insulator layer includes forming an insulator comprising tantalum pentoxide.

13. The method as recited in claim 8 wherein forming a damascene interconnect structure includes forming a plurality of interconnect structures electrically isolated from each other by a dielectric material and forming an insulator layer includes forming an insulator layer on each of the plurality of interconnect structures.

14. The method as recited in claim 8 wherein forming a damascene interconnect structure includes forming an outermost damascene interconnect structure, forming an insulator layer includes forming an outermost capping layer and forming a conductive layer includes forming an outermost conductive layer on at least a portion of the insulator layer.

15. The method as recited in claim 14 wherein forming a conductive layer includes forming a bond pad from a portion of the conductive layer.

16. The method as recited in claim 8 wherein forming the semiconductor device includes forming a CMOS device.

17. The method as recited in claim 8 further comprising forming a dielectric layer over the capacitor and planarizing the dielectric layer to a substantial planar surface.

18. The capacitor as recited in claim 1 wherein the second capacitor electrode is a second damascene capacitor electrode.

* * * * *